United States Patent [19]

Vaitkus et al.

[11] Patent Number: 5,622,586
[45] Date of Patent: Apr. 22, 1997

[54] METHOD OF FABRICATING DEVICE MADE OF THIN DIAMOND FOIL

[75] Inventors: Rimantas Vaitkus, Vilnius, Lithuania; Takashi Inushima; Masaya Kadono, both of Kanagawa, Japan

[73] Assignee: Semiconductor Energy Laboratory Co., Ltd., Kanagawa-ken, Japan

[21] Appl. No.: 366,573

[22] Filed: Dec. 30, 1994

[30] Foreign Application Priority Data

Jan. 10, 1994 [JP] Japan ................... 6-012201

[51] Int. Cl.⁶ ..................................... B32B 31/00
[52] U.S. Cl. .................. 156/247; 156/249; 156/344; 73/204.26; 148/DIG. 135; 216/20; 437/974
[58] Field of Search ..................... 156/344, 247, 156/249; 437/974; 216/13, 36, 16, 20; 148/DIG. 135, DIG. 2; 73/204.26, 204.25

[56] References Cited

U.S. PATENT DOCUMENTS

| | | | |
|---|---|---|---|
| 3,181,986 | 5/1965 | Pritkin | 156/247 X |
| 3,350,250 | 10/1967 | Sanz et al. | 156/247 X |
| 4,159,222 | 6/1979 | Lebow et al. | 156/249 X |
| 4,722,765 | 2/1988 | Ambros et al. | 216/20 X |
| 4,995,941 | 2/1991 | Nelson et al. | 156/247 X |
| 5,013,397 | 5/1991 | Tsukakoshi | 156/249 X |
| 5,074,035 | 12/1991 | Tyznik | 156/247 X |
| 5,131,963 | 7/1992 | Ravi | 437/974 X |
| 5,272,104 | 12/1993 | Schrantz et al. | 437/974 X |
| 5,376,579 | 12/1994 | Annamalai | 437/974 X |
| 5,391,250 | 2/1995 | Cheney, II et al. | 156/286 X |
| 5,406,841 | 4/1995 | Kimura | 73/204.26 |

FOREIGN PATENT DOCUMENTS

| | | | |
|---|---|---|---|
| 516671 | 9/1955 | Canada | 216/20 |
| 2-107923 | 4/1990 | Japan | 73/204.25 |
| 4-343023 | 11/1992 | Japan | 83/204.25 |

*Primary Examiner*—David A. Simmons
*Assistant Examiner*—Paul M. Rivard
*Attorney, Agent, or Firm*—Sixbey, Friedman, Leedom & Ferguson, P.C.; Gerald J. Ferguson, Jr.

[57] ABSTRACT

Method of fabricating a device made of a thin diamond film having a thickness of less than 10 μm which is difficult to handle. The method is initiated by forming a thin diamond film on a silicon substrate to a thickness of about 5 μm by chemical vapor deposition. Then, paraffin is applied. The substrate is removed with hydrofluoric acid. Thus, the diamond film is retained on the paraffin that is made to act as a base. A required circuit is formed on the surface of the diamond film. Finally, the paraffin is removed. In this way, a device using the diamond film is completed. This structure can be used as a device for measuring thermal effect, using a thin diamond film. For example, the structure can be used for fabrication of a flowsensor.

7 Claims, 12 Drawing Sheets

FIG.1H  YAG LASER LIGHT

METHOD OF FABRICATING DEVICE MADE OF THIN DIAMOND FOIL

BACKGROUND OF THE INVENTION

1. Field of the Invention

The present invention relates to a device structure using a thin-film material and also to a method of fabricating such a device structure. More particularly, the invention relates to a device structure applied to a sensor for measuring the flow rate of a fluid and also to a method of fabricating this device structure.

2. Description of the Related Art

Instruments for measuring flow rates are generally known as flowmeters or fluid meters. One known type of such instruments makes use of a thermistor. In particular, this known instrument utilizes the fact that when heat is carried off by a fluid, the temperature of the thermistor drops. Generally, if the thermistor is in contact with the fluid, the amount of heat carried away from the thermistor depends on the flow rate or flow velocity. Therefore, a certain correlation exists between the output from the thermistor and the flow rate. Hence, the flow rate can be calculated from the output from the thermistor.

The flow rate is the product of the cross-sectional area of the fluid and the flow velocity. It is now assumed that a fluid is flowing through a circular pipe having an inside diameter of r at a flow velocity of v. The flow rate is given by $v\pi r^2$, for example in liters/min. Therefore, if the cross-sectional area of the fluid is known, the flow rate and the flow velocity can be found simultaneously.

Generally, a thermistor refers to a semiconductor having a large negative temperature coefficient. Intrinsically, however, a thermistor means a thermally sensitive resistor and so thermistors should not be restricted by the signs (positive or negative) of their temperature coefficients or by their materials. Consequently, metals such as platinum having positive temperature coefficients can be referred to as thermistors.

Devices using materials whose resistances are changed by temperature variations such as thermistors are collectively known as temperature measuring resistors, temperature sensing elements, or resistance thermometers. Also, it can be said that materials whose resistances are varied by temperature variations perform thermistor functions. Materials whose resistances are varied by temperature variations are hereinafter referred to as temperature measuring resistor.

The above-described method of measuring flow rates employs a thermistor. In another method, a resistive heating element which produces heat by the Joule effect is exposed to a fluid. The amount of heat carried away from this heating element depends on the flow rate. The electrical current flowing through the heating element is measured. In this way, the flow rate can be calculated.

In a further method, a fluid is made to carry away heat from a heating element in contact with the fluid. The amount of heat carried by the fluid is measured by a separate temperature measuring resistor such as a platinum sensor. In this way, the flow rate is computed.

These known flowmeters fabricated by the prior art techniques have the problem that their measurable range is limited. For example, the range is given by only one or two digits.

We have fabricated a flowsensor using a thin diamond film having a high thermal conductivity. Flow rates were measured, using nitrogen gas. This diamond flowsensor was composed of the thin diamond film on which a heating element consisting of a thin platinum film and a temperature measuring resistor were installed. The diamond film is several micrometers thick and several millimeters square.

During measurement, the thin diamond film was maintained in a thermally floating state as accurately as possible. The diamond film was brought into contact with a fluid. Heat in the form of pulses was applied to the diamond film from a heating element. The resulting changes in the temperature of the diamond film were measured by a temperature measuring resistor.

At this time, the thin diamond film was quickly heated by the heat in the form of pulses and then cooled. Correspondingly, the output from the temperature measuring resistor varied quickly and regained the original value. That is, the temperature measuring resistor produced a certain responsive waveform. Since the area of this waveform accurately corresponded to the flow rate, the area of the responsive waveform produced from the temperature measuring resistor was calculated whenever heat in the form of a single pulse is applied. In this way, measurement of the flow rate could be performed.

More specifically, heat in the form of a pulse persisting for 0.18 second was applied every 4 seconds. The area of the responsive waveform was calculated. In this way, the flow rate was measured every 4 seconds. In practice, flow rates could be measured over a wide range from tens of sccm to hundreds of thousands of sccm. It can be said that this method of measurement produces a much wider dynamic range than the prior art flow rate-measuring instruments such as mass flowmeters.

In the above-described structure, the flow rate is calculated from the characteristics of the response of the thin diamond film to the applied heat in the form of pulses. It can be understood that the response characteristics of the diamond film reflect the thermal effect of the surroundings on the film.

The principle of the above-described measurement of flow rates can be understood in the manner described now. When a fluid touches the thin diamond film, an amount of heat corresponding to the flow rate of the fluid is carried away from the diamond film. In other words, the diamond film is thermally affected by the fluid by an amount corresponding to the flow rate of the fluid. This thermal effect is reflected in the characteristics of thermal response to the applied heat in the form of pulses. This response characteristics affect the manner in which the diamond film is heated by the heat in the form of pulses and the manner in which the film is cooled and thus can be observed.

These response characteristics reflect thermal effect of the surrounding on the diamond film. Also, the thermal effect corresponds to the flow rate of the fluid flowing in contact with the diamond film. As a result, the response characteristics correspond to the flow rate of the fluid flowing in contact with the diamond film.

The foregoing discussion is based on the ideal assumption that the thermal effect on the diamond film depends on the flow rate of the fluid flowing in contact with the diamond film. However, where a thin-film material is contacted with a fluid and the flow rate is measured, the thermal effect on the thin-film material can be attributed to the following factors:

(1) Thermal action between the thin-film material and the fluid.

(2) The amount of heat flowing out of the thin-film material into a base that holds the thin-film material.

(3) The amount of heat carried away from the thin-film material via lead wires or conductors.

Of these factors, a flowsensor needs only the thermal action (1) above. The thermal effects due to (2) and (3) should be minimized. Therefore, it is necessary to realize a structure which does not permit heat to be carried away from the thin-film material except into the fluid. That is, it is important that the thin-film material be thermally insulated and retained so that the thermal effect on the thin-film material arises mainly from the fluid flowing in contact with the thin film.

It is quite useful to use a thin diamond film as the thin-film material. However, it is difficult to machine a thin diamond film into a desired device shape. For example, it is difficult to even pick up a thin diamond film having a thickness of less than 5 μm with forceps.

A known method of machining a thin diamond film uses irradiation of laser light. For example, cutting of CVD thin diamond films, using YAG laser light, is reported in "New Diamond, Vol. 6, No. 2, p. 36" and in "The proceedings of the Society of Accurate Machining of Japan, 56/12/1990".

Where a thin diamond film is formed by CVD on a silicon wafer and then it is machined by irradiation of YAG laser light, the diamond film peels off, breaks, or cracks, because a stress is exerted between the silicon wafer and the diamond film.

Where a device using a thin diamond film should be fabricated, it is necessary to fabricate an electronic apparatus or circuit on the surface of the diamond film. However, this fabrication is not easy to carry out, because the diamond film is in a mechanically unstable state. That is, it is difficult to fabricate an electronic apparatus or circuit on the surface of a thin diamond film which is formed on a silicon wafer.

Indeed this problem may be alleviated by selecting a substrate other than silicon wafer or by appropriately selecting conditions in which the diamond film is fabricated, but the problem cannot be essentially solved. A method of increasing the strength of the film itself by increasing the thickness above 100 μm may be contemplated. However, increasing the thickness is not desirable from an economical point of view.

SUMMARY OF THE INVENTION

It is an object of the present invention to provide a device fabricated out of a thin-film material whose strength would normally present problems.

It is another object of the invention to provide a method of fabricating the device described in the preceding paragraph.

It is a further object of the invention to provide a device using a thin diamond film as its thin-film material.

It is a yet other object of the invention to provide a method of fabricating a device out of a thin diamond film.

A method of fabricating a device according to the invention comprises the steps of: forming a thin film on a first base; adhesively bonding a second base to the thin film; removing the first base to expose a surface of the thin film; forming an electronic apparatus (e.g. a circuit) on the exposed surface of the thin film; cutting the thin film into a desired shape; and cutting the second base into a desired form.

In the above-described method, one example of the first base is a silicon wafer. The thin film is formed on this first base. An example of the thin film is a thin film of diamond.

It can be expected that the thin diamond film exhibits a thermal conductivity of more than 1000 W m$^{-1}$ K$^{-1}$ (300 K) in the direction of the thickness. Therefore, the diamond film is the optimum material for use as a device for measuring thermal effect such as a flowsensor. Where a material other than diamond is used in a device for measuring thermal effect, it is necessary that thermal conductivity of the used material is as great as possible. For example, silicon carbide, boron nitride, aluminum nitride, and nitrogen can be used. To enable high-speed operation, it is desired to use a material having a thermal conductivity larger than that (148 W m$^{-1}$ K$^{-1}$ (300 K)) of a single crystal of silicon as the thin-film material. If high-speed response is not needed, ceramic materials and oxides and nitrides having lower thermal conductivities can be used as the thin-film material.

CVD (chemical vapor deposition) can be one example of the method of forming the thin film. Where a thin diamond film is employed as the thin film, it is not an advantage to obtain a large thickness because the deposition rate is low. Where mechanical strength and heat capacity are taken into account, it suffices to secure a thickness of about 5 μm. If sufficient mechanical strength is secured, the thickness can be reduced down to about 1 μm. Of course, if the cost produces no problems, then the thickness can be set larger than 10 μm.

The second base acts to temporarily hold the thin film during machining operation of the thin film. The thin film is adhesively bonded to the second base because it is necessary to separate the thin film from the second base later. In this method, no stress is exerted between the thin film and the second base. At least one unit can be fabricated on the second base.

Another method of fabricating a device according to the present invention comprises the steps of: forming a thin film on a first base; adhesively bonding a second base to the thin film;

removing the first base to expose a surface of the thin film; forming a circuit on the exposed surface of the thin film; cutting the second base and the thin film on the second base into a desired shape to obtain at least one cut potion of said second base having at least one unit provided on said cut portion; holding said at least one unit on a third base with said at least one unit being provided on said cut portion; and removing said cut portion of the second base from said at least one unit.

In this method, the first and second bases have the same features as in the method described previously. Where a flowsensor is fabricated, utilizing this structure, it is important to use a material which has a low thermal conductivity and thus can be regarded as a thermally insulating material as the third base. This third base is used to hold the thin-film material in practice. Where a sensor for measuring thermal effect is built, it is necessary that at least the relation given by $$K_1 \geq 100 K_2$$

be satisfied, where $K_1$ and $K_2$ are the thermal conductivities of thin-film material and the third base, respectively. In order to evaluate the thermal effect on the thin-film material more accurately, the requirement $K_1 \geq 1000 K_2$ must be met.

As an example, a thin diamond film having a thermal conductivity close to or more than 1000 W m$^{-1}$ K$^{-1}$ (300 K) is used as the thin film. The third base is made of Teflon having a thermal conductivity of less than 1 W m$^{-1}$ K$^{-1}$ (300 K). The flow rate of a fluid flowing in contact with the diamond film should be measured. In this case, it has been confirmed that the flow rate of nitrogen can be measured quite accurately over a dynamic range given by three or more digits. We consider that these characteristics are attributable to the fact that the thermal conductivity of the base is less than one thousandth of the thermal conductivity of the diamond film. Hence, the thermal effect of the fluid on the diamond film can be accurately evaluated. Usable materials other than Teflon include polycarbonate, acrylic resin, various ceramics, various plastic materials, and various resinous materials. In any case, a material satisfying the requirements, i.e., being hard, resistant to heat, and having a small thermal conductivity, is preferably selected.

A device according to the invention comprises: a thin film having a heating element and a temperature measuring resistor formed thereon; a base made of a heat-insulating material and having electrodes and conductive interconnects formed thereon; and a conductive adhesive via which the heating element and the temperature measuring resistor are connected with the electrodes formed on the base, wherein the thin film is held on the base by the conductive adhesive.

The above-described structure pertains to a device for evaluating the thermal effect of the surrounding on the thin-film material, e.g., a flowsensor. In the above structure, it is necessary that the base be made of such a low thermal conductivity that the base can be regarded as a thermal insulator with respect to the thin-film material. Where the device acts to evaluate the thermal effect of the surroundings on the thin-film material, the thermal conductivity $K_2$ of the base and the thermal conductivity $K_1$ of the thin-film material must satisfy the relation $K_1 \geq 100\, K_2$. More preferably, the relation $K_1 \geq 1000\, K_2$ is met. That is, it is necessary that the base be regarded as a heat insulator compared with the thin-film material.

Preferably, a resinous material such as Teflon is used as the heat insulator forming the base. Preferably, a material having a high thermal conductivity typified by diamond is used as the thin film material.

The structure described above is characterized in that electrodes on the surface of the base are in contact with a heating element or a temperature measuring resistor (or its electrodes) formed on the surface of the thin film. The thin film is used to measure the thermal effect and so the degree of thermal communication with the base must be reduced to a minimum. Accordingly, the structure in which the thin film is in contact with the base at a minimum number of points as described above is of importance.

Another device according to the present invention comprises:

a thin diamond film having plural electrodes provided on at least one surface thereof;

a base having plural electrodes provided on at least one surface thereof; and a conductive adhesive via which at least one of said plural electrodes provided on said at least one surface of said thin diamond film is connected with at least one of said plural electrodes provided on said at least one surface of said base, wherein said diamond film is held on said base by said conductive adhesive.

Other objects and features of the invention will appear in the course of the description thereof, which follows.

BRIEF DESCRIPTION OF THE DRAWINGS

FIGS. 1(A)–1(J) are cross sections illustrating the fabrication sequence of a method according to the invention;

DESCRIPTION OF THE PREFERRED EMBODIMENTS

Flowsensors are hereinafter described as examples of devices. Also, a thin diamond film is hereinafter described as an example of thin-film material for fabricating a device. The invention can be applied to other types of device fabrication using a thin diamond film. Furthermore, the invention can be applied to devices using a thin-film material other than thin diamond film.

EXAMPLE 1

The present example is a method of mass-producing flowsensors using thin diamond film.

Figure 1A:
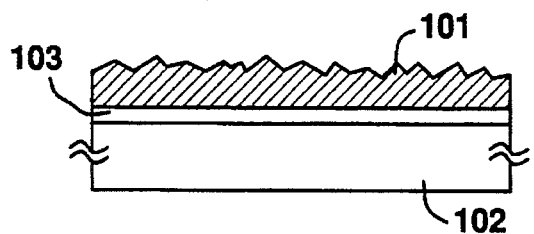

The process sequence of the present example is illustrated in FIGS. 1(A)–1(J). First, as shown in FIG. 1(A), a silicon substrate 102 having a silicon oxide film 103 formed thereon is prepared. A thin diamond film 101 is formed on the substrate 102 by microwave plasma CVD in the presence of a magnetic field under the following conditions:

| | |
|---|---|
| substrate temperature: | 800° C. |
| reaction pressure: | 0.25 Torr |
| microwave power: | 4 kW |
| reaction gases: | $CH_3OH:H_2 = 1:4$ |
| film formation time: | 10 hours |
| film thickness: | 5 µm |

The surface of the thin diamond film 101 formed by the plasma CVD is uneven. We consider that crystals grow like pillars from the interface with the surface of the substrate, thus forming the uneven surface.

The above film formation conditions are also adopted in the following examples. Chemical vapor deposition methods other than the above-described method can also be utilized. The silicon substrate 102 is not always required to have the silicon oxide film 103 formed thereon. The substrate may be made from silicon oxide or other material.

Figure 1F:
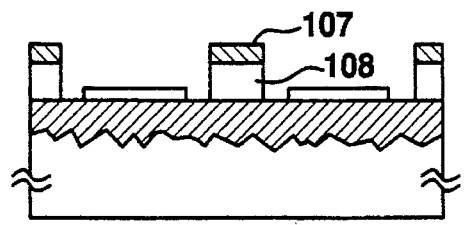
Figure 1B:
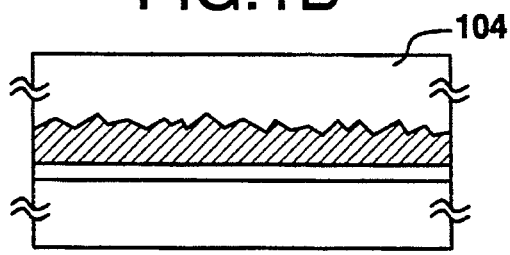

Then, as shown in FIG. 1(B), paraffin 104 is applied to the thin diamond film 101 to a thickness of about 1 cm. Other usable materials include epoxy resin and low-melt metals such as silver solder and other solders.

Figure 1G:
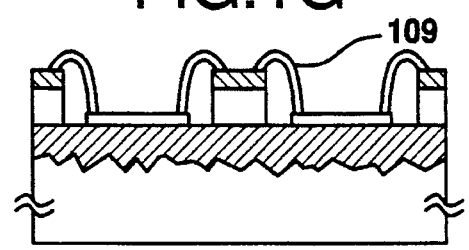
Figure 1C:
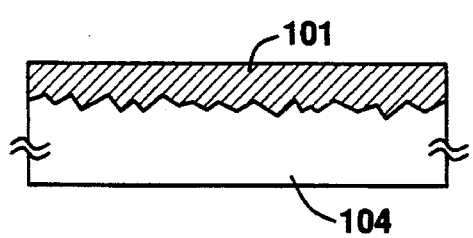
Figure 1C:
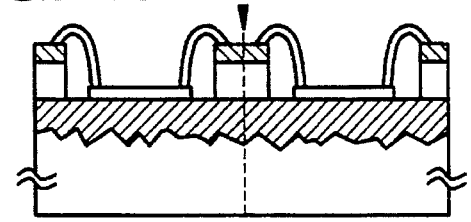

Thereafter, the silicon substrate 102 is etched away with a solution of HF and HNO$_3$. In this way, as shown in FIG. 1(C), the thin diamond film 101 exists on the paraffin 104. It is to be noted that FIG. 1(C) is a view taken from the opposite direction to FIG. 1(B). Under this condition, the paraffin 104 acts as a base holding the diamond film 101. In this state, the surface of the diamond film is ultrasonically cleaned, using a neutral or alkaline detergent.

in this step, such an etchant is required to be selected that the paraffin 104 is not removed simultaneously with removal of the silicon substrate 102. That is, the etchant must permit the substrate 102 to be removed alone. Under the condition shown in FIG. 1(C), the smooth surface of the diamond film is exposed.

Figure 1D:
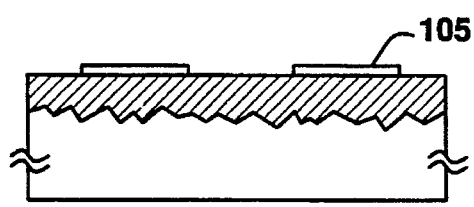

Then, thin films 105 of platinum (Pt) becoming a thermistor and a heater, respectively, are formed on the diamond film 101 to a thickness of about 2000 Å by means of selecting coating, using a mask. This step is carried out by sputtering techniques. In this way, the condition shown in FIG. 1(D) is obtained.

Figure 1I:
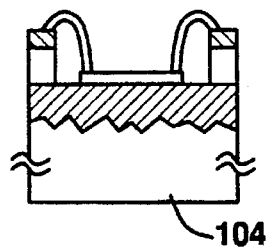
Figure 1E:
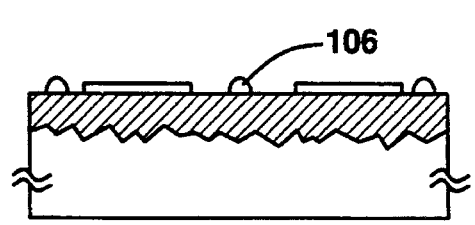

An adhesive 106 is then printed to bond a printed circuit board forming a leadframe (FIG. 1(E)).

A Teflon board 108 on which electrodes 107 forming the leadframe are formed is bonded with the adhesive 106 (FIG. 1(F)).

The thickness of this Teflon board 108 is approximately 100 μm. The board 108 is shaped like a lattice so as to surround the thin films 105 of platinum. The electrodes 107 forming the leadframe are formed on the board 108. The electrodes 107 are made of a film of stainless steel. The Teflon board alone may be formed on the thin diamond film 101 prior to the formation of the electrodes 107.

This Teflon board 108 is necessary to provide thermal insulation between the thin diamond film 101 and the electrodes 107. Accordingly, the board 108 is required to be made from a material having a sufficiently large heat resistance. The board 108 may be made from epoxy or other resin, as well as Teflon.

Then, the thin platinum films 105 are bonded to the electrodes 107 by wire bonding, using a gold wire 109 having a diameter of 10 μm. In this way, the state shown in FIG. 1(G) is obtained. The wire 109 should be made as thin as possible. It is necessary that heat be not readily transferred from the platinum films 105.

Figure 2:
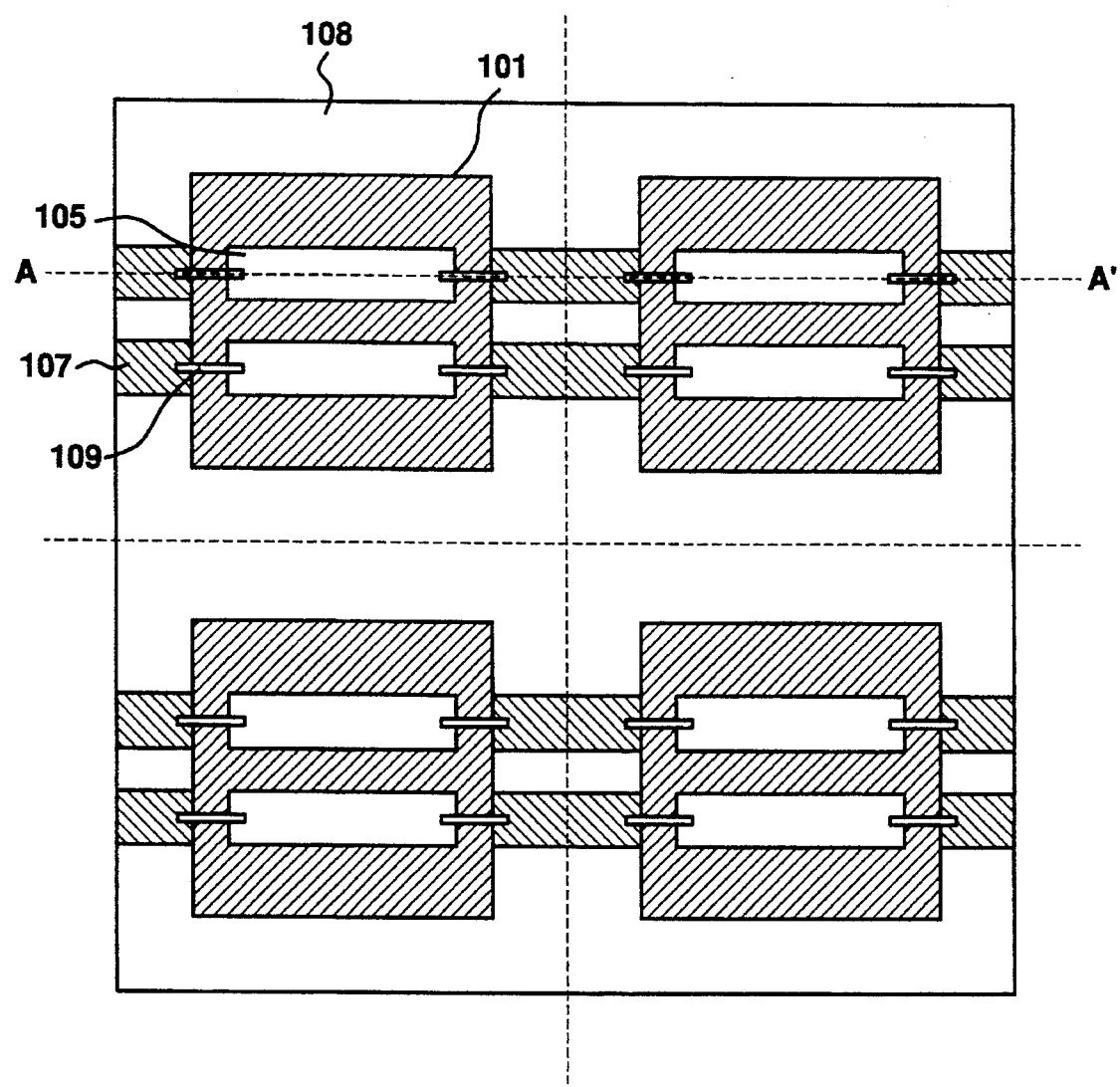
FIG. 2 is a top view of the device shown in FIG. 1(G)

At this time, plural flowsensor units are formed on the surface of the thin diamond film 101. FIG. 2 is a top view of the diamond film under the condition of FIG. 1(G). It is to be noted that like components are indicated by like reference numerals in various figures. FIG. 1(G) is a cross section taken along line A—A' of FIG. 2. In the state of FIG. 1(G), the plural units (partitioned by the broken lines in FIG. 2) are fabricated out of the diamond film 101. In each unit, one of the two thin platinum films 105 acts as a heater, while the other acts as a thermistor, or temperature measuring resistor.

After the condition shown in FIG. 1(G) is obtained, the flowsensor units are separated (FIG. 1(I)) by irradiation of YAG laser light (FIG. 1(H)).

Figure 1J:
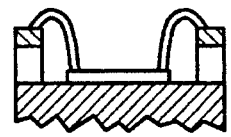

Then, the paraffin 104 is peeled off. As shown in FIG. 1(J), one flowsensor unit using the thin diamond film is obtained. This peeling operation can be easily performed, using a solvent. In this flowsensor unit, the required circuit is formed on the surface of the diamond film 101 which is held by the Teflon board 108.

EXAMPLE 2

The present example is similar to Example 1 described above except that the flowsensor units are held by the board installed in a pipe or duct through which a gas, liquid, or other fluid whose flow rate is to be measured flows.

Figure 3A:
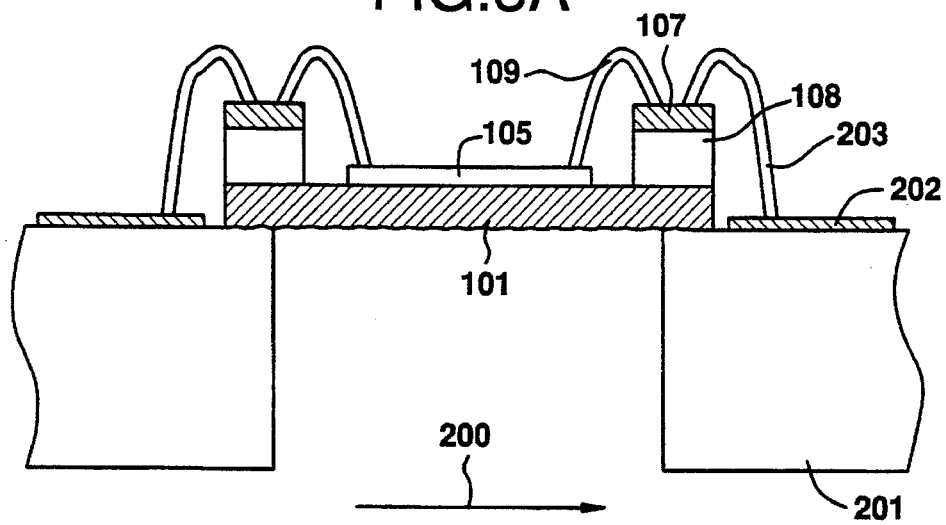
FIGS. 3(A)–3(C) are side elevations showing devices according to the invention.
Figure 3B:
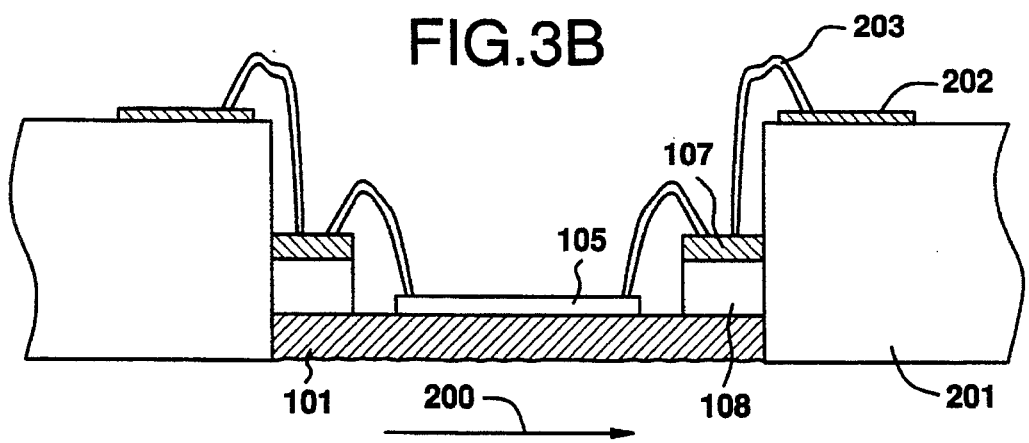
Figure 3C:
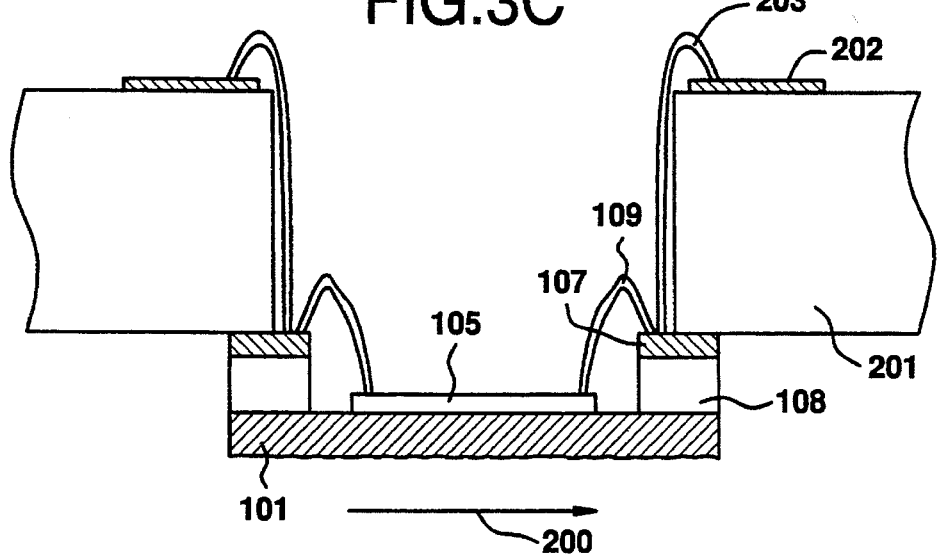

The manner in which one flowsensor unit is held is shown in FIGS. 3(A)–3(C). That is, the flowsensor unit shown in FIG. 1(J) is shown to be held on the base in FIGS. 3(A)–3(C). In these figures, a base 201 is made of Teflon and acts to hold the flowsensor unit. This base 201 is fitted or mounted in the pipe or duct.

Electrodes 202 are formed on the base 201. Lead wires 203 are connected from the flowsensor unit to the electrodes 202 by wire bonding. Further lead wires extend from the electrodes 202 to a peripheral circuit. A fluid flows along the uneven surface of the thin diamond film, i.e. along a surface opposite to the surface on which the circuit is formed, as indicated by the arrow 200.

The base 201 is made of Teflon to reduce the amount of heat flowing out of the thin diamond film 101 to a minimum. Therefore, where the base 201 is fabricated out of a material other than Teflon, it is necessary that the material have a minimum thermal conductivity.

The examples illustrated in FIGS. 3(A)–3(C) are now described. FIG. 3(A) illustrates an example in which a flowsensor unit is installed outside the base 201. In this case, it is necessary to minimize the surface area of the portion of the thin diamond film 101 in contact with the base 201 because it is necessary to minimize the amount of heat flowing out of the diamond film 101 into the base 201, or thermal interaction between the diamond film 101 and the base 201. This permits the thermal effect of the fluid 200 on the diamond film to be precisely evaluated. In the present example, the diamond film 101 and the base 201 are bonded together via a resinous adhesive.

The configuration shown in FIG. 3(A) has the advantage that it is easy to manufacture but the flowsensor is installed in the depth of the concave portion. Therefore, the flow of the fluid 200 in contact with the surface of the diamond film 101 forming the flowsensor unit is prone to vary and so this structure is unsuited for accurate measurement.

The configuration shown in FIG. 3(B) shows an example in which the base 201 and the thin diamond film 101 are substantially flush with each other. Since any factor disturbing the flow of the fluid does not exist, the flow rate can be accurately measured. However, it is necessary to fit the flowsensor unit into the base 201. Consequently, they are required to be accurately dimensioned.

In the example of FIG. 3(C), a flowsensor unit is stuck on the surface of the base 201 which is in contact with a fluid. This structure permits accurate measurement and is easy to install.

In the examples of FIGS. 3(B) and 3(C), the electrodes 107 and 202 are interconnected by wire bonding. As indicated by the broken lines 400 in FIGS. 4(A) and 4(B), lead wires may be formed inside the base 201.

Figure 4A:
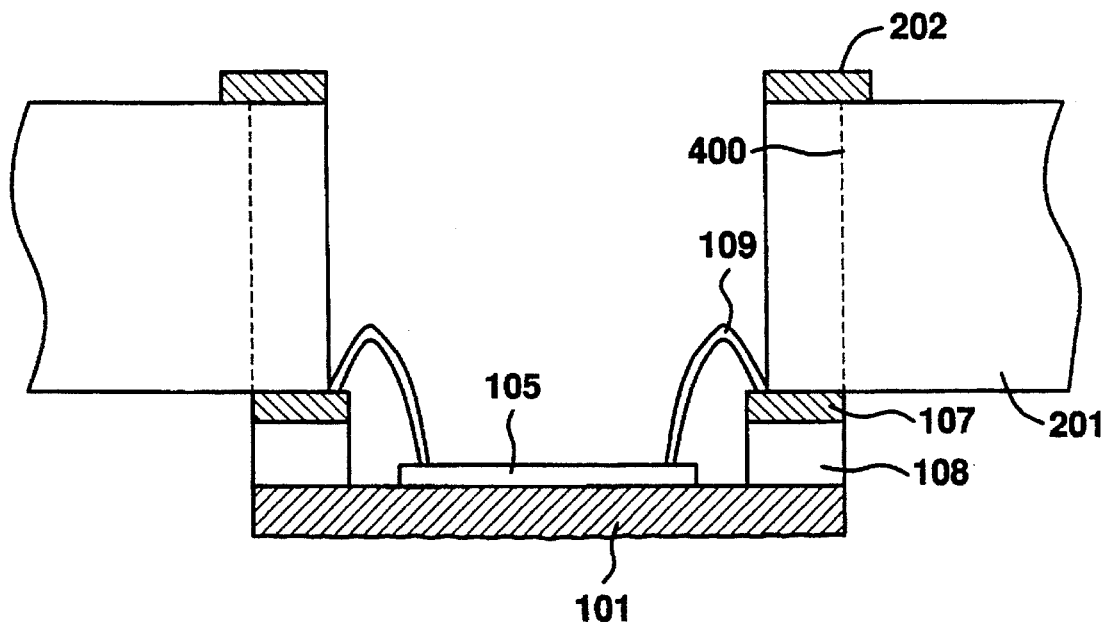
FIGS. 4(A) and 4(B) are side elevations showing other devices according to the invention.
Figure 4B:
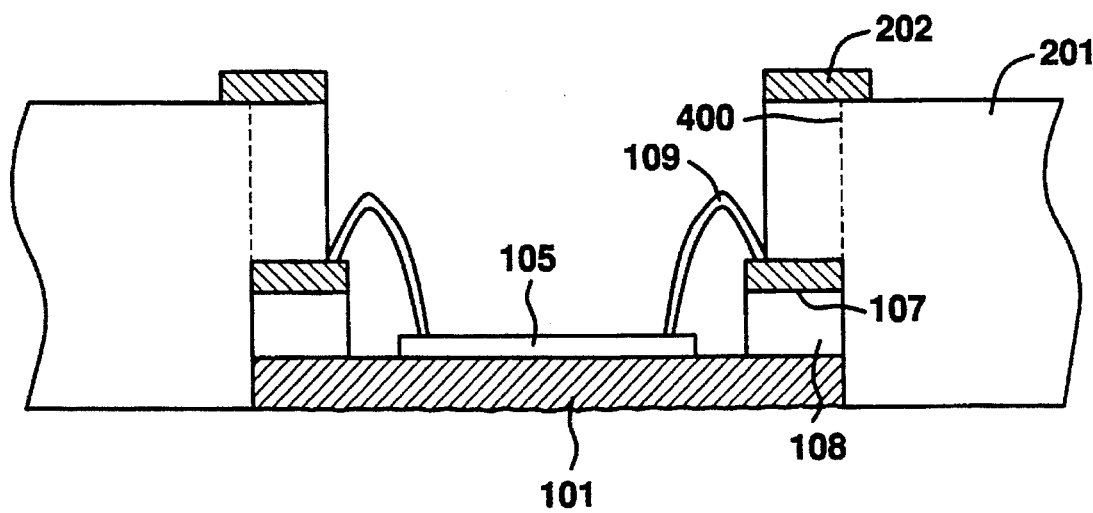
Figure 5:
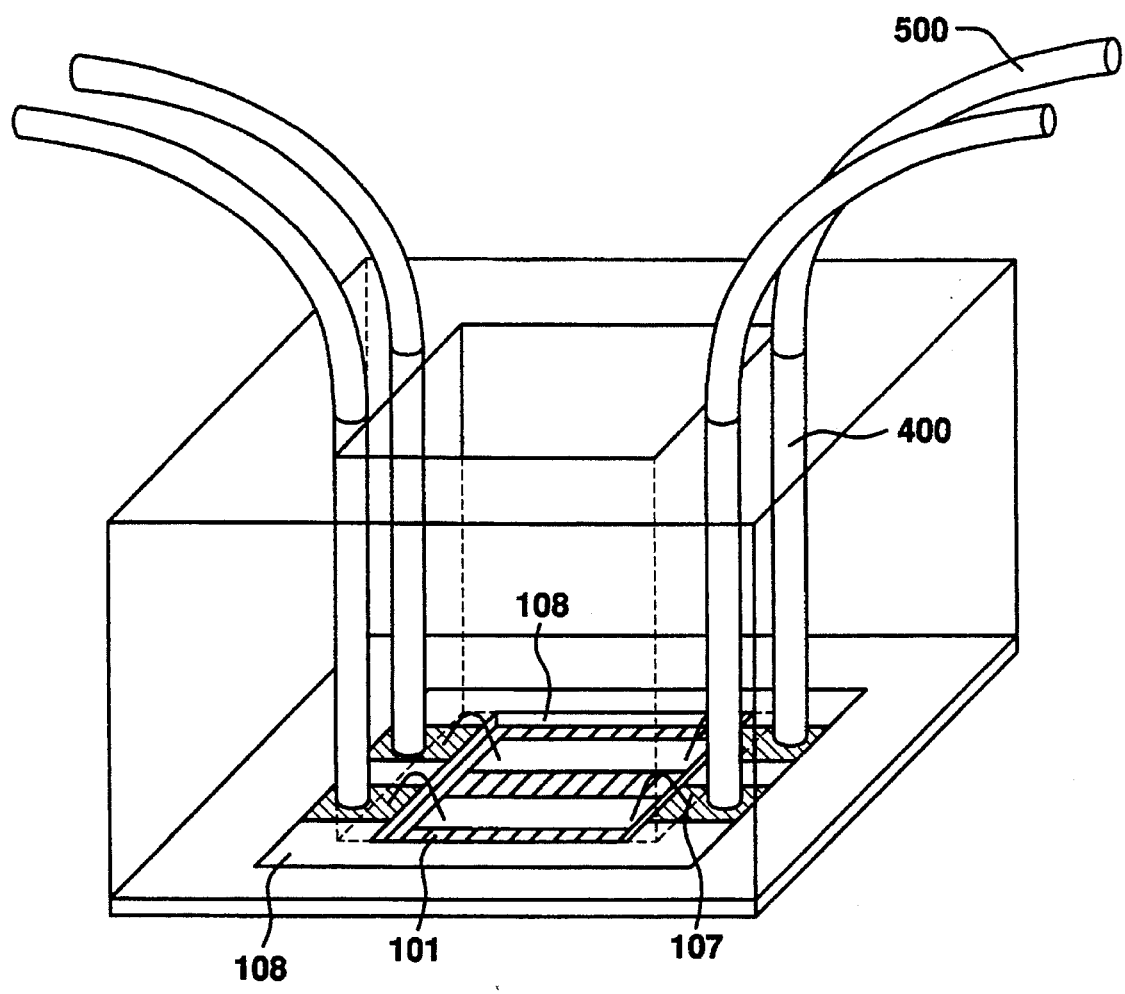
FIG. 5 is a perspective view showing a further device according to the invention.

FIG. 5 is a three-dimensional representation of the structure shown in FIG. 4(A). In FIG. 5, lead wires 500 are directly brought out without forming the electrodes 202.

EXAMPLE 3

Figure 6A:
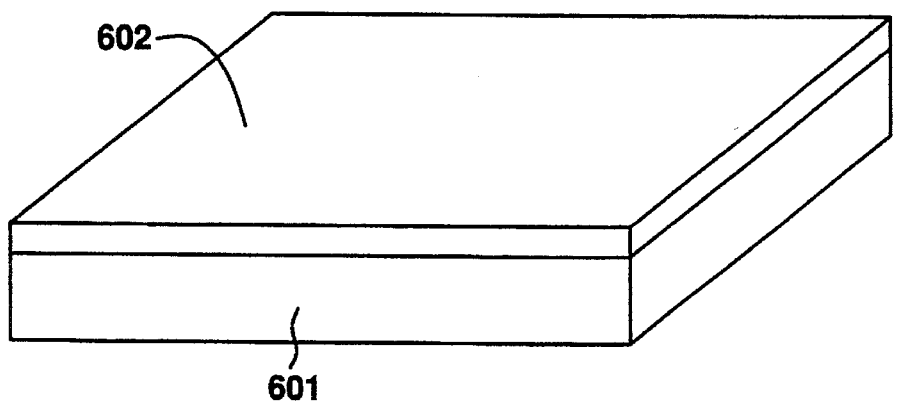
FIGS. 6(A)–6(C) are perspective views illustrating the process sequence of a method according to the invention.

In the present example, a flowsensor is fabricated without performing wire bonding. First, as shown in FIG. 6(A), a thin diamond film having a thickness of 5 μm is formed on a silicon substrate 601 by microwave plasma CVD in the presence of a magnetic field as described in Example 1.

Figure 6B:
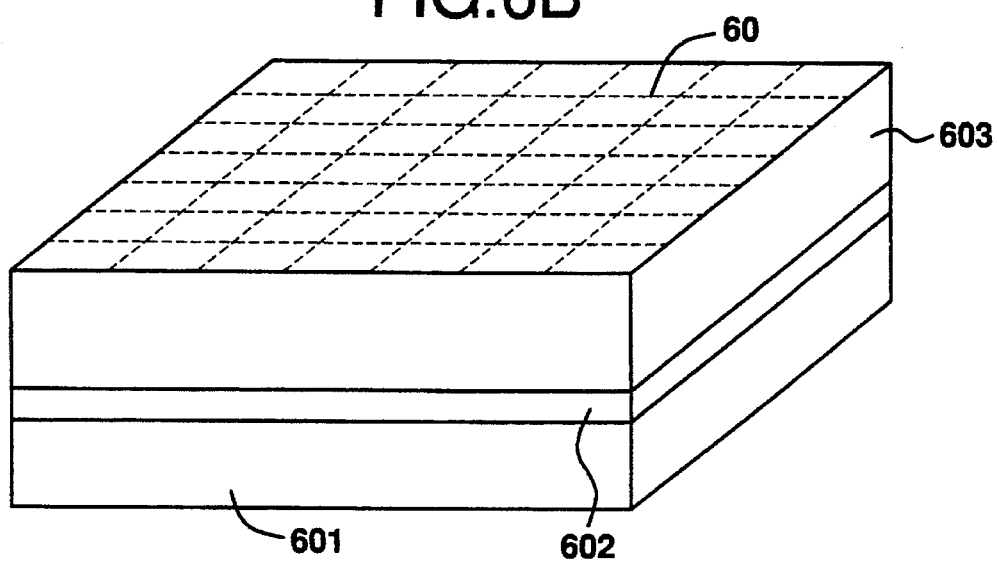

Then, a glass substrate 603 having a thickness of 0.5 μm is temporarily attached with an adhesive which can be removed by heating or using a solvent (FIG. 6(B)). In this example, Crystalbond 509 manufactured by Aremco Inc. is used as the adhesive for temporal attachment. Since this adhesive dissolves easily in acetone, the adhesive can be readily removed after the temporal attachment. An adhesive which dissolves when heated after bonding may also be used. Furthermore, an adhesive which dissolves in methanol may be employed.

Since the glass substrate is required to be cut into rectangles each measuring 2 mm by 2 mm in a later step, the substrate is previously formed with scribe lines 60 forming the rectangles each measuring 2 mm by 2 mm.

The glass substrate is used because the following requirements are satisfied:

(1) It is necessary to remove the silicon substrate 601 by hydrofluoric acid. At this time, it is necessary that a substrate portion 603 be left behind. Therefore, a material that is resistant to hydrofluoric acid is needed.

(2) The substrate 603 is used as a base for temporarily holding a thin diamond film. For this reason, the substrate is required to have sufficient mechanical strength.

Of course, if the conditions (1) and (2) above are satisfied, materials other than the glass substrate may be used.

Figure 6C:
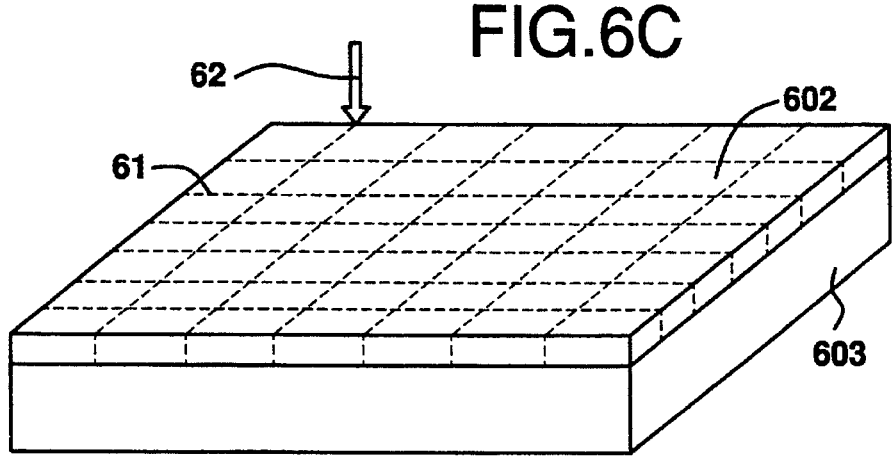

Then, the silicon substrate 601 is dissolved away with hydrofluoric acid. In this way, the condition shown in FIG. 6(C) is derived. In FIG. 6(C), the device is inverted compared with the state shown in FIGS. 6(A) and 6(B).

A mask having a given pattern is placed and sputtering is carried out to form a circuit out of platinum. As a result, circuit patterns as shown in FIG. 7 are formed on the thin diamond film 602.

These circuit patterns are formed in a rectangle 2 mm square, the rectangle being indicated by 71. These circuit patterns include a platinum circuit pattern 600 connecting a pair of electrodes 605 and another platinum circuit pattern 604 connecting a pair of electrodes 606. The electrodes 605 and 606 are made of platinum, and each measures 200 μm by 200 μm. The diamond film formed in the 2-mm square forms one flowsensor unit.

Figure 7:
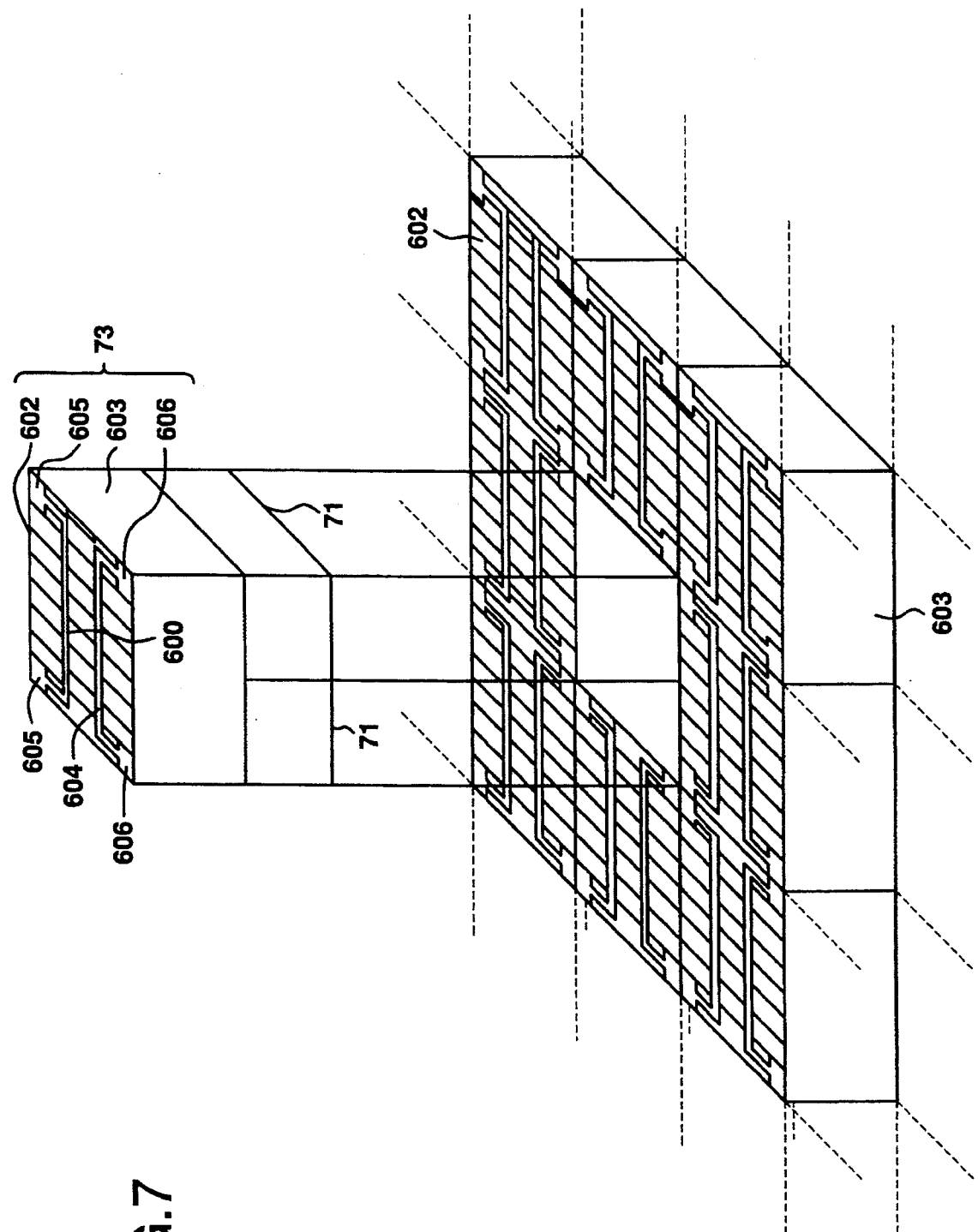
FIG. 7 is a perspective view of a yet other device according to the invention.

In FIG. 7, indicated by 600 is a heating element. Indicated by 604 is a temperature measuring resistor acting as a thermistor. The required functions can be obtained by adjusting their resistance values. The resistance values are adjusted by adjusting their areas or the thicknesses of the platinum films.

After the formation of the circuit patterns, laser light 62 as shown in FIG. 6(C) is irradiated to cut the diamond film 602. In this step, the diamond film 602 is cut into rectangles, each measuring 2 mm by 2 mm, by the use of YAG laser. Since the YAG laser light penetrates the glass substrate, the diamond film 602, the adhesive for temporarily bonding the film 602 to the glass substrate 603, and the circuit patterns formed on the diamond film 602 are simultaneously cut. As a result of this step, the 2 mm square diamond films each having the heating element 600, the temperature measuring resistor 604, and the electrodes thereon are obtained. In this state, the 2 mm square thin diamond films separated from each other on the same substrate are bonded with the temporarily holding adhesive.

In the above step, the scribe lines 60 previously formed in the glass substrate 603 must agree with lines 61 cut by the laser light 62.

The diamond film 602 can be cut by the YAG laser light having a wavelength of about 1 μm because the thin diamond film 602 is made of a polycrystalline film and that impurities at the grain boundaries absorb light of 1 μm and generate heat. Laser light other than YAG laser light may also be used.

After the end of the separating step using the irradiation of YAG laser light, the glass substrate 603 is mechanically cut along the patterns cut into the diamond film. In this way, the condition indicated by 73 in FIG. 7 is obtained. In particular, one sensor unit is provided on each glass substrate of 0.5 mm in thickness and 2 mm square and comprises the heating element 600, the temperature measuring resistor 604, and their electrodes provided on the 5 μm diamond film which is, in turn, temporarily bonded with the adhesive to the surface of the glass substrate. The base for holding the flowsensor unit 2 mm square is now described by referring to FIG. 8, where the base is indicated by 607. The base 607 has a thickness of 1 mm and is made of Teflon. The base has a cutout in its central portion 615. Electrode pairs 608, 609, 610, and 611 are formed. The electrodes 608 are connected with the electrodes 610 by a patterned metallization 612. Similarly, the electrodes 609 are connected with the electrodes 611 by a patterned metallization 613. The electrodes 610 and 611 are formed on the rear surface of the base 607, i.e., on the surface opposite to the surface on which the electrodes 608 and 609 are formed. Where the material of the base 607 is other than Teflon, the material must have a quite small thermal conductivity.

The electrodes 608 and 609 are each 100 μm square. The electrodes 610 and 611 are each 300 μm square. The patterned metallization 613 has a linewidth of 100 μm and a thickness of 5000 Å.

The linewidth of the patterned metallization 613, especially the linewidths of the patterned metallization portions formed on the same surface as the electrodes 608 and 609, are required to be reduced as small as possible. Also, it is necessary to make the metallization as thin as possible, in order to minimize heat transfer through these portions.

Figure 8:
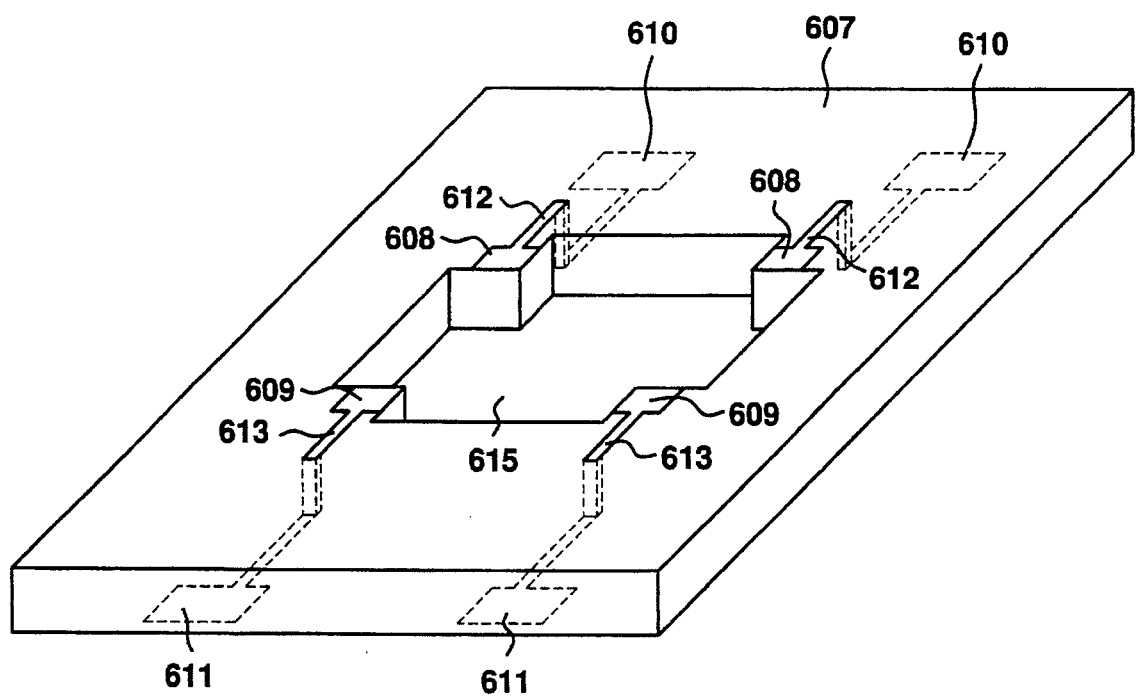
FIG. 8 is a perspective view of a base that holds a sensor unit.
Figure 9:
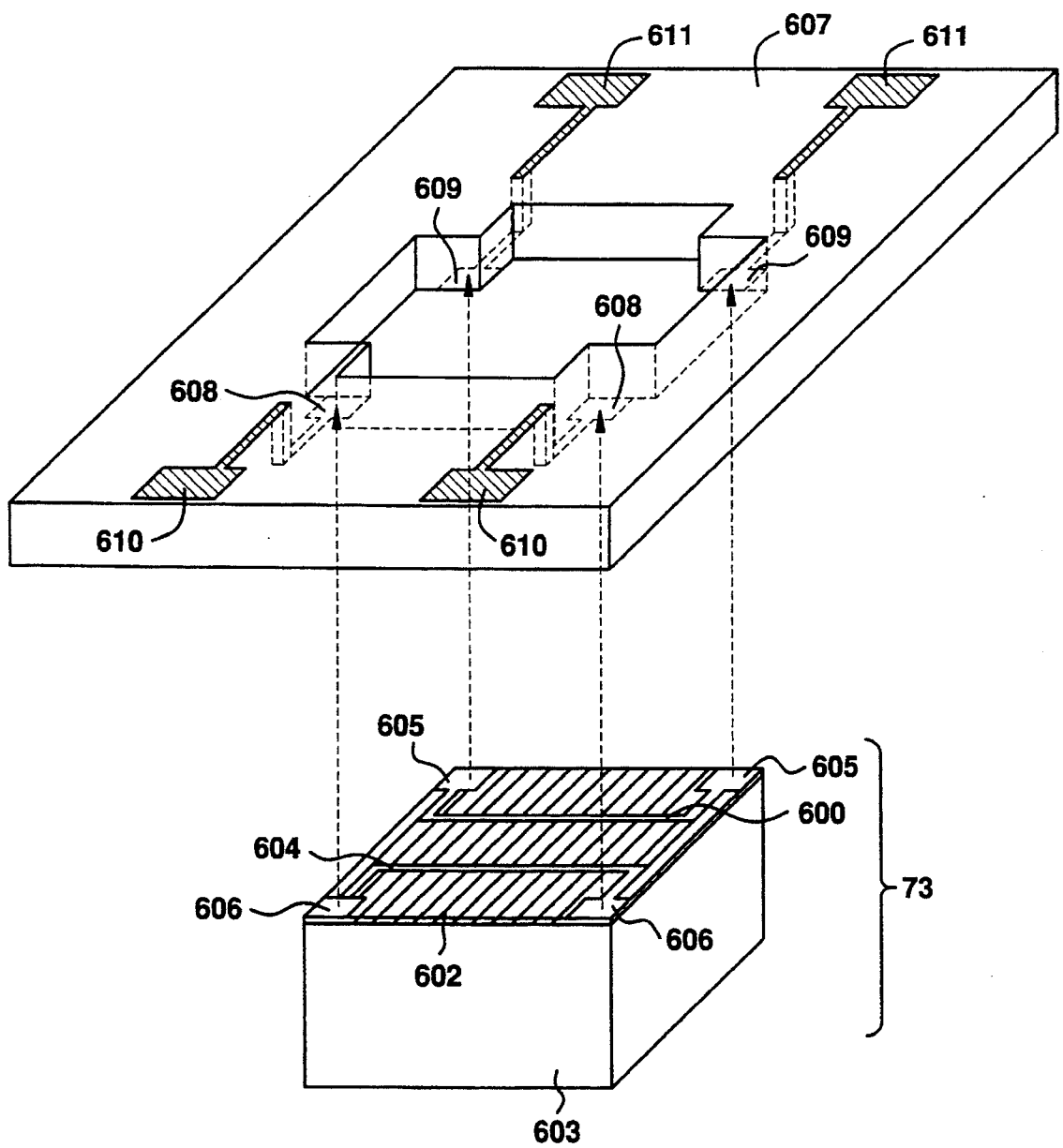
FIG. 9 is a perspective view of the base shown in FIG. 8 and the sensor unit, illustrating the manner in which the sensor unit is coupled to the base.

After the state indicated by 73 in FIG. 7 is obtained, the base 607 shown in FIG. 8 is bonded to one flowsensor unit. In this stage, the glass substrate 603 temporarily bonded acts as a base for holding the 2 mm square diamond film 602 forming one flowsensor unit.

The base is bonded to the flowsensor unit in the manner described now. The electrodes 606 on the flowsensor unit are connected with the electrodes 608 on the base with a UV-curable conductive resin. Also, the electrodes 605 on the flowsensor unit are connected with the electrodes 609 on the base with the UV-curable conductive resin. The flowsensor unit is in contact with the base 607 only at the points of the electrodes 605, 606, 608, and 609.

Figure 10:
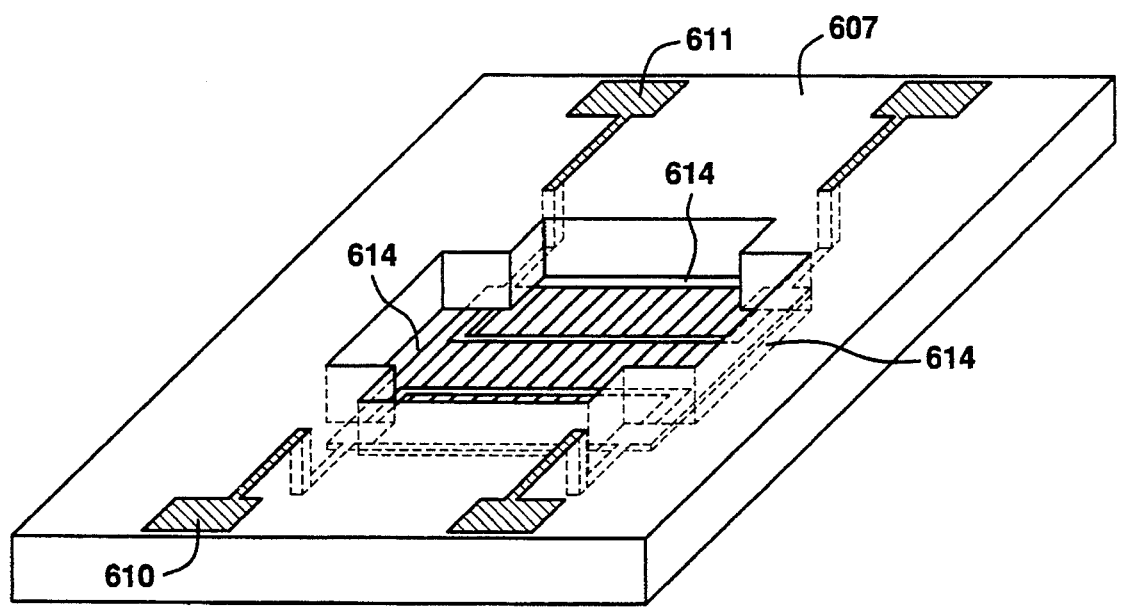
FIG. 10 is a perspective view similar to FIG. 8, but showing another base.
Figure 11:
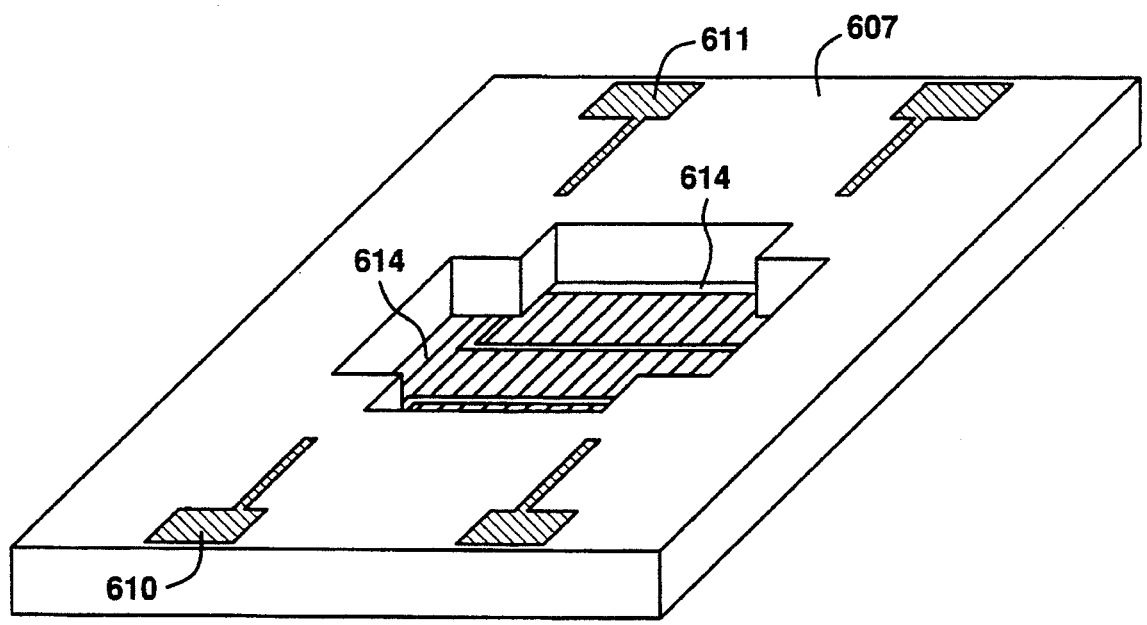
FIG. 11 is a perspective view similar to FIG. 8, but showing a further base.
Figure 12:
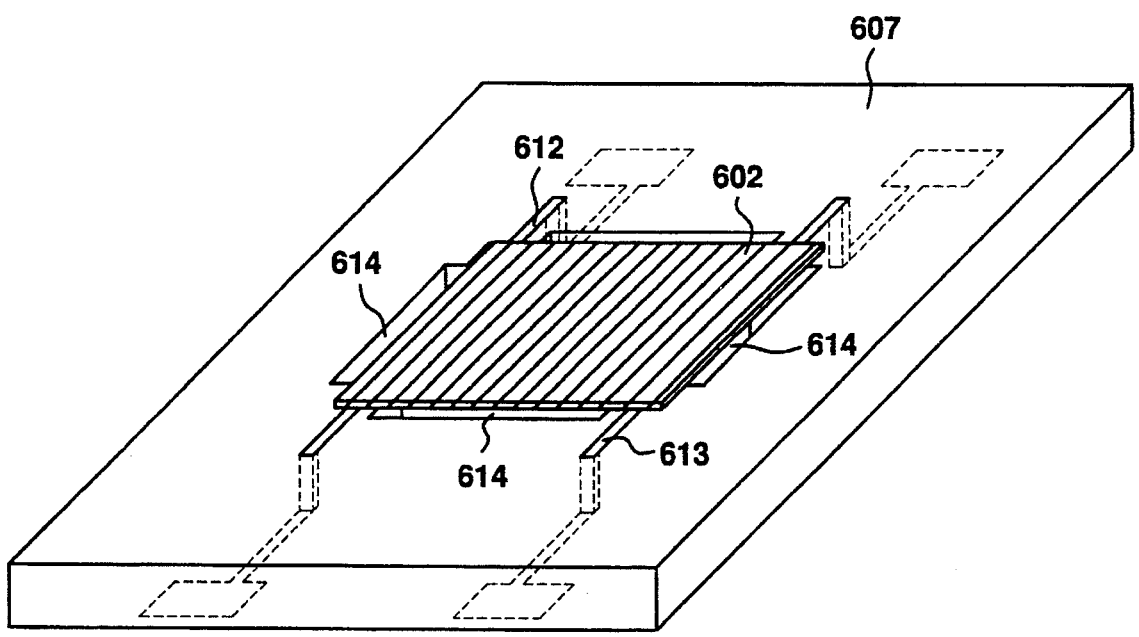
FIG. 12 is a perspective view similar to FIG. 8, but showing a still other base.

Thereafter, the adhesive temporarily bonding the diamond film 602 to the glass substrate 603 is removed or the adhesiveness is made to be lost by heating or using a solvent. In this way, the glass substrate 603 is removed. Thus, the flowsensor shown in FIGS. 10–12 is completed. The flowsensor is held to the Teflon base 607. The function of the flowsensor can be performed by connecting lead wires with the electrodes 610 and 611.

FIGS. 10 and 11 are views taken from the same angle. In FIG. 10, shadow portions are indicated by broken lines. FIG. 12 is a view obtained by turning over FIG. 10.

The structure shown in FIGS. 10–12 have gaps 614 having a width of about 500 μm. These gaps protect the thin diamond film 602 against pressure. That is, the gaps make uniform the pressure applied to both surfaces of the diamond film.

In the structure shown in FIGS. 10–12, those portions of the diamond film 602 and the base 607 which are in contact with each other are only the electrode portions that are in contact with each. This minimizes both the amount of heat flowing from the diamond film 602 to the base 607 and the amount of heat flowing out of the diamond film 602 via lead wires.

As described previously, the thermal effect on the thin-film material of the flowsensor can be attributed to the following factors: (1) factor related to fluid; (2) factor related to the base; and (3) factor related to the lead wires or conductors.

What is necessary for flow rate measurement is only the factor (1) above. Therefore, the factors (2) and (3) should be reduced to a minimum. Where the structure of the present example is adopted, the effects of the factors (2) and (3) can be reduced to a minimum. Consequently, a quite high performance flowsensor can be obtained. Since the flowsensor can be fabricated without effecting wire bonding, its productivity can be enhanced. Furthermore, the reliability of the flowsensor acting as a device can be improved. The device fabrication method described in the present example is especially advantageous where the thickness of the thin diamond film whose strength would normally present problems is less than 10 μm.

EXAMPLE 4

The present example is similar to the flowsensor fabrication method described in Example 3 except that a substrate for absorbing laser light that acts to cut the thin diamond film is used as the substrate 603 for temporarily holding the diamond film 602. The use of the substrate absorbing laser light permits the substrate to be cut by laser light. Therefore, in the stage shown in FIG. 6(C), the substrate 603 that is a temporary base, and the diamond film 602 are cut simultaneously, by the laser radiation, the diamond film 602 being held on the substrate 603 via adhesive. For example, light emitted by a YAG laser can be used as the laser light.

In the present example, the material of the substrate 603 is required to (1) have acid resistance, (2) have sufficient mechanical strength, and (3) absorb the used laser light, thus permitting the substrate to be cut with the laser light.

No restrictions are imposed on the kind of the substrate 603 as long as the material satisfies the conditions (1)–(3) above. Phosphate glass which is normally used to block light or absorb heat ray can be used as a material that meets the conditions (1)–(3) above.

The use of the inventive structure makes it possible to enhance the productivity and the reliability of devices using thin-film materials. Especially, fabrication of devices using a thin diamond film whose strength would have been heretofore presented problems can be put into practical use. Hence, productivity and reliability of diamond devices can be improved greatly.

What is claimed is:

1. A method of fabricating a device comprising the steps of:

forming a thin film on a first base wherein said thin film is made of diamond;

adhesively bonding a second base to said thin film;

removing said first base from said thin film to expose a surface of said thin film;

forming a circuit on said exposed surface of said thin film;

cutting said thin film into a desired shape; and removing said second base from the cut thin film having the circuit formed thereon.

2. The method of claim 1 wherein said thin film is made of diamond and has a thickness of less than 10 μm.

3. The method of claim 1 wherein said thin film is made of diamond, and wherein said cutting step is carried out by irradiation of laser light.

4. A method of fabricating a device comprising the steps of:

forming a thin film on a first base wherein said thin film is made of diamond;

adhesively bonding a second base to said thin film;

removing said first base from said thin film to expose a surface of said thin film;

forming a circuit on said exposed surface of said thin film;

cutting said second base and said thin film on said second base simultaneously into a desired shape; and removing said second base from the cut thin film having the circuit formed thereon.

5. The method of claim 4 wherein said thin film is made of diamond and has a thickness of less than 10 μm.

6. The method of claim 4 wherein said thin film is made of diamond, and wherein said cutting step is carried out by irradiation of laser light.

7. A method of fabricating a device comprising the steps of:

forming a thin film on a first base;

adhesively bonding a second base to said thin film;

removing said first base to expose a surface of said thin film;

forming a circuit on said exposed surface of said thin film;

cutting said second base and said thin film on said second base into a desired shape to obtain at least one cut portion of said second base having at least one unit provided on said cut portion;

holding said at least one unit on a third base with said at least one unit being provided on said cut portion; and removing said cut portion of said second base from said at least one unit.

* * * * *